(12) United States Patent
Mitome et al.

(10) Patent No.: US 8,466,753 B2
(45) Date of Patent: Jun. 18, 2013

(54) SURFACE MOUNTED CRYSTAL OSCILLATOR

(75) Inventors: Hiroyuki Mitome, Saitama (JP);
Daisuke Nishiyama, Saitama (JP);
Masakazu Nishiwaki, Saitama (JP);
Hiroyuki Murakoshi, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 66 days.

(21) Appl. No.: 13/231,917

(22) Filed: Sep. 13, 2011

(65) Prior Publication Data

US 2012/0235761 A1    Sep. 20, 2012

(30) Foreign Application Priority Data

Sep. 14, 2010 (JP) ................................. 2010-205572
Jul. 13, 2011 (JP) ................................. 2011-154623

(51) Int. Cl.
*H03B 5/30* (2006.01)
*H03B 1/02* (2006.01)

(52) U.S. Cl.
USPC ............................................ 331/68; 331/158

(58) Field of Classification Search
USPC ..................... 331/68, 69, 116 R, 116 FE, 158
See application file for complete search history.

(56) References Cited

U.S. PATENT DOCUMENTS

2010/0201453 A1* 8/2010 Kasahara ........................ 331/68
2010/0289589 A1* 11/2010 Ito et al. .......................... 331/70

FOREIGN PATENT DOCUMENTS

JP    2010-154227    7/2010

* cited by examiner

*Primary Examiner* — Ryan Johnson
(74) *Attorney, Agent, or Firm* — Jianq Chyun IP Office

(57) ABSTRACT

A metal base having plural protrusions at its bottom is engaged with and placed on standing metal pins in plural through holes provided in a base board, and a circuit board is fitted to an upper end of the metal pins. A crystal resonator is arranged on the circuit board via a heater element, and the metal base is covered with a metal cover, thereby obtaining a sealed structure of the crystal resonator. A two-stage counterbored portion including a first-stage and a second-stage counterbored portions is formed in the bottom of the base board, and a solder or conductive resin is filled in a gap between the first-stage counterbored portion formed around the metal pin inserted into the through hole, and the through hole and the metal pin to fix the metal pin in the though hole. Slits penetrating through the base board are formed around the metal pin.

5 Claims, 5 Drawing Sheets

SURFACE MOUNTED CRYSTAL OSCILLATOR

CROSS-REFERENCE TO RELATED APPLICATION

This application claims the priority benefit of Japan application serial no. 2010-205572, filed Sep. 14, 2010 and the priority benefit of Japan application serial no. 2011-154623, filed Jul. 13, 2011. The entirety of each of the above-mentioned patent applications is hereby incorporated by reference herein and made a part of this specification.

TECHNICAL FIELD

The present invention relates to a surface mounted crystal oscillator (hereinafter, referred to as "crystal oscillator"), and more specifically, relates to a crystal oscillator provided with a sealed structure, in which an occurrence of frequency change due to a change in humidity is prevented by preventing moisture from penetrating into the crystal oscillator, and escape of heat from a heater element of the crystal oscillator is also prevented.

BACKGROUND ART

As shown in FIG. 6, in a conventional oven-controlled crystal oscillator (OCXO) 20, a circuit board 23 formed of glass epoxy resin is fitted to upper ends of, for example, four earth pins 22a and 22b arranged on a glass epoxy board 21 in a standing condition, a metal plate 24 is fitted to a lower face of the circuit board 23 via a radiation sheet 25, and further, a crystal resonator 26 is fitted to a lower face of the metal plate 24. Moreover, an electronic part 27 such as a circuit element is mounted on an upper face of the circuit board 23, and terminals 29 of the crystal resonator 26 are provided in a protruding condition. Furthermore, the glass epoxy board 21 is covered with a metal cover 28, and the metal cover 28 is soldered at a plurality of positions W (for example, two positions) on an outer peripheral edge of the glass epoxy board 21 and sealed.

Prior Art Document

[Patent Document 1] Japanese Unexamined Patent Publication No. 2010-154227

SUMMARY OF THE INVENTION

Problems to be Solved by the Invention

However, in this type of oven-controlled crystal oscillator (OCXO), as described above, after the parts of the oscillator are arranged on the glass epoxy board, and a metal base is covered with the metal cover, the metal cover is soldered at a plurality of positions (for example, two positions) on the outer peripheral edge of the metal base and sealed. Hence, the oven-controlled crystal oscillator (OCXO) does not have a complete sealed structure. Therefore, moisture penetrates into the crystal oscillator from the outer peripheral edge of the soldered metal cover, and furthermore, the circuit board itself formed of the glass epoxy resin causes the moisture to pass therethrough. As a result, the frequency of the crystal oscillator changes due to the moisture, and environmental humidity affects the inside of the crystal oscillator, thereby causing a change in frequency of the crystal oscillator. Consequently, there is a problem in that this type of surface mounted oven-controlled crystal oscillator cannot sufficiently respond to high customer demands with respect to frequency stability.

Means for Solving the Problems

In order to solve the aforementioned problem, in the surface mounted crystal oscillator of the present invention, a metal base provided with a plurality of protrusions at the bottom thereof is engaged with and placed on metal pins arranged in a standing condition in a plurality of through holes provided in a base board, and a circuit board is fitted to an upper end of the metal pins. Moreover, a crystal resonator is arranged on the circuit board via a heater element, and the metal base is covered with a metal cover, thereby obtaining a sealed structure of the crystal resonator. Furthermore, a two-stage counterbored portion including a first-stage counterbored portion and a second-stage counterbored portion having a larger diameter than that of the first-stage counterbored portion is formed in the bottom of the base board, and a solder or conductive resin is filled in a gap between the first-stage counterbored portion formed around the metal pin inserted into the through hole, and the through hole and the metal pin to fix the metal pin in the though hole.

Moreover, in the surface mounted crystal oscillator of the present invention, a copper foil is adhered to an upper face of the base board around the through hole, and a copper-plated portion is formed on an inner periphery of the through hole and an upper face of the copper foil, and furthermore, so as to cover the first-stage counterbored portion.

Furthermore, in the surface mounted crystal oscillator of the present invention, the first-stage counterbored portion has a tapered shape.

Moreover, in the surface mounted crystal oscillator of the present invention, slits are formed in four sides of each metal pin fixed to the base board, and penetrating therethrough.

In the surface mounted crystal oscillator of the present invention, slits are formed on two or four sides of the base board in parallel with each other so as to surround a plurality of the metal pins fixed to the base board, penetrating therethrough.

EFFECTS OF THE INVENTION

In the present invention, the bottom of a through hole, through which a terminal (metal pin) of the crystal oscillator passes, is counterbored in two stages in a base board, and the terminal is fixed to the through hole by using a solder or conductive resin. Consequently, the plated portion applied to the through hole, the solder or conductive resin, or the terminal, does not protrude from the ground (bottom) of the base board. As a result, a crystal oscillator that can be mounted on a mount board accurately and reliably in a customer's factory and can prevent escape of heat from a heater element with a complete sealed structure can be constructed.

BRIEF DESCRIPTION OF THE DRAWINGS

FIG. 3(a) shows a state in which the two-stage counterbored portion is formed in the ground (bottom) side of the base board, and copper plating is applied to a first-stage counterbored portion. FIG. 3(b) shows a state in which a terminal (metal pin) is inserted into a through hole applied with copper plating, a solder or conductive adhesive is filled in the through hole, and the tip end portion of the terminal is cut as shown by the imaginary line.

FIG. 5(a) is a bottom view of the surface mounted crystal oscillator of the present invention in which slits surrounding each metal pin from four directions are provided, and FIG. 5(b) is a bottom view of the surface mounted crystal oscillator of the present invention in which long and thin groove-like penetrating slits are provided proximity to four sides of the base board parallel to each other so as to surround a plurality of metal pins.

BEST MODE FOR CARRYING OUT THE INVENTION

Embodiments

Figure 1:
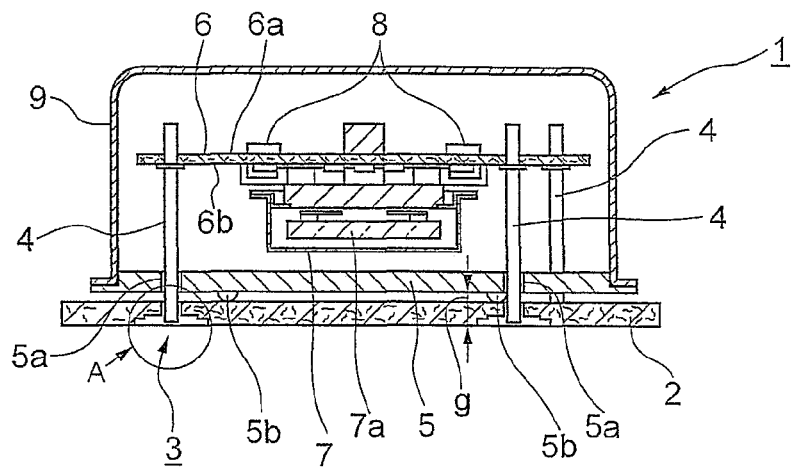
FIG. 1 is a longitudinal sectional view of an embodiment of a surface mounted crystal oscillator of the present invention.
Figure 2:
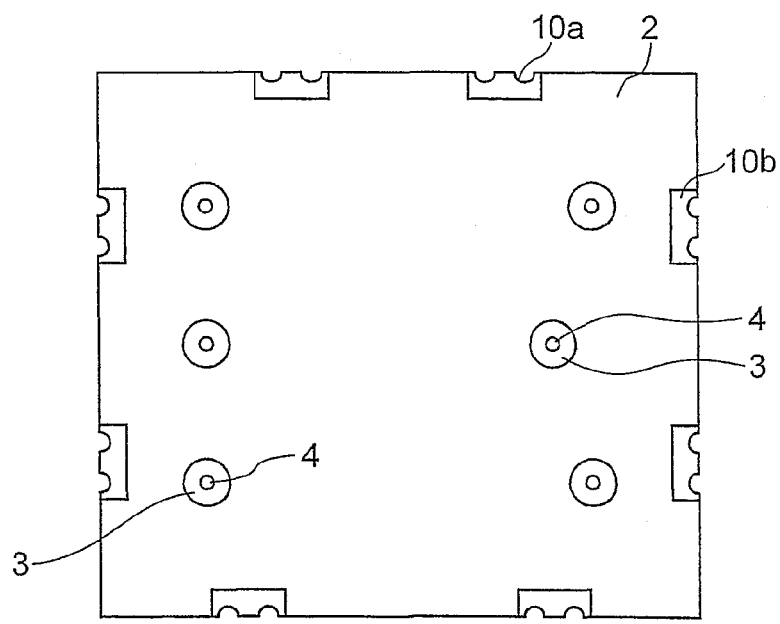
FIG. 2 is a bottom view of the surface mounted crystal oscillator of the present invention shown in FIG. 1, as seen from a direction of the ground (bottom) of a base board.

FIG. 1 is a longitudinal sectional view of an oven-controlled crystal oscillator (OCXO), which is an embodiment of a surface mounted crystal oscillator (hereinafter, referred to as a "crystal oscillator") of the present invention. FIG. 2 is a plan view (bottom view) of the oven-controlled crystal oscillator in the embodiment, as seen from a direction of the ground (bottom) of a base board thereof.

As shown in FIG. 1 and FIG. 2, in a crystal oscillator 1 of the embodiment of the present invention, metal pins (terminals) 4 are inserted via seal members (glass) 5a, into a plurality of through holes 2b which vertically penetrate through a base board 2 formed of glass epoxy resin, and into a plurality of through holes which penetrate through a metal base 5, and are arranged in a standing condition. The metal base 5 is placed on the upper face of the base board 2 via, for example, four standoffs (protrusions) 5b provided at the bottom of the metal base 5 in a protruding manner. A circuit board 6 formed of glass epoxy resin provided with circuit elements 8 and the like on an upper face 6a thereof, is fitted to the upper end of the plurality of metal pins 4. As shown in FIG. 1, a gap g is formed between the metal base 5 and the base board 2 formed of glass epoxy resin, by providing the standoffs 5b at the bottom of the metal base 5 in a protruding manner, so that heat generated in the OCXO hardly escapes toward the base board 2. A crystal resonator 7, which houses a crystal vibrating reed 7a, is arranged at the bottom 6b of the circuit board 6 via a heater element (not shown). Moreover, end face through-holes 10a and 10b soldered to a customer's device substrate, are formed in the side face of each side of the base board 2.

A metal cover 9 is set over the crystal resonator 7 from above and mounted on an outer peripheral edge of the upper face of the metal base 5, and the outer peripheral edge is sealed by soldering or resistance welding so as to be a sealed structure.

Figure 3A:
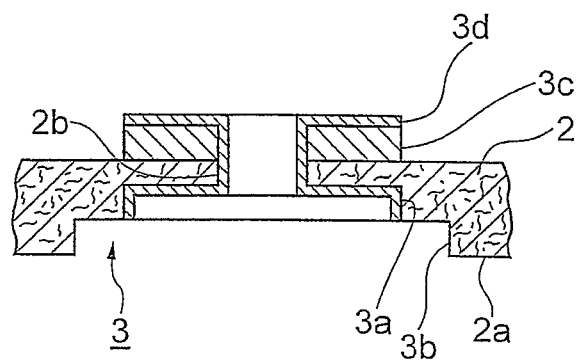
FIGS. 3(a) and 3(b) are enlarged longitudinal sectional views of a two-stage counterbored portion shown by arrow A in FIG. 1.
Figure 3B:
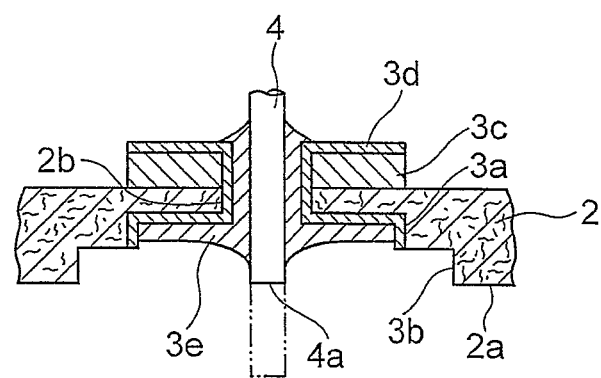

Here, in the crystal oscillator 1 of the embodiment of the present invention, a counterbored portion 3 shown by arrow A in FIG. 1 is formed as a two-stage counterbored portion 3 as shown in FIG. 3(a), and the metal pin (terminal) 4 is inserted into the through hole 2b and fixed in the through hole 2b by a solder or conductive adhesive as shown in FIG. 3(b). According to this configuration, a situation where the metal pin (terminal) 4, a copper-plated portion 3d, and the solder or conductive adhesive 3e protrude from the ground (bottom) 2a of the base board 2, and these members contact with a mount board at the time of mounting the crystal oscillator of the present invention to a mount board in a customer's factory, is prevented.

That is to say, as shown in FIG. 3(a), as seen from a direction of the ground (bottom) 2a of the base board 2, a first-stage counterbored portion 3a having a circular shape in plan view and a second-stage counterbored portion 3b having a larger diameter than that of the first-stage counterbored portion 3a are formed around the through hole 2b formed in the base board 2 by a counterbore drill or the like, thereby constituting a two-stage counterbored portion 3.

Subsequently, a copper foil 3c is formed around the through hole 2b on an upper face of the base board 2, and the copper-plated portion 3d is formed by electrolytic plating so as to cover the upper face of the copper foil 3c, the inner periphery of the through hole 2b, and the first-stage counterbored portion 3a, thereby forming an electrode. An Ni-plated portion and a gold-plated portion can be further formed on the copper-plated portion 3d by electroless plating.

Thereafter, as shown in FIG. 3(b), the metal pin 4 is inserted into the through hole 2b around which the copper-plated portion 3d is formed, and a solder or conductive resin 3d is filled around the metal pin 4 to fix the metal pin 4 in the through hole 2b via the copper-plated portion 3d.

The tip end 4a of the metal pin 4 is mounted on a characteristic regulating apparatus for the crystal oscillator 1 to regulate the characteristic thereof. After regulation of the characteristic, a portion indicated by the imaginary line at the tip end 4a of the metal pin 4 shown in FIG. 3(b) is cut or bent in an L-shape to such a length that the metal pin does not protrude from the base board 2 after being inserted into the base board 2, and that the base board 2 and the metal pin 4 can be connected to each other, so that the tip end 4a of the metal pin 4 does not protrude from the ground (bottom) 2a of the base board 2.

Figure 4A:
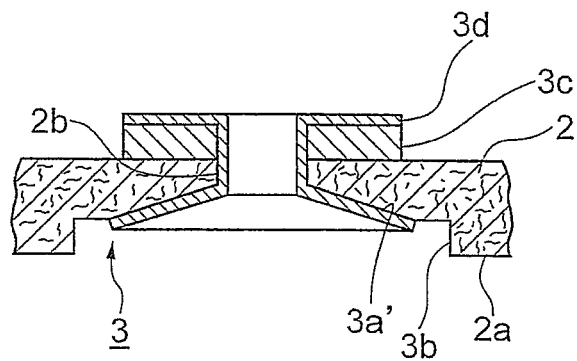
FIG. 4(a) shows a state in which a tapered portion is formed in the ground (bottom) side of the base board instead of the two-stage counterbored portion, and copper plating is applied to the tapered portion.
Figure 4B:
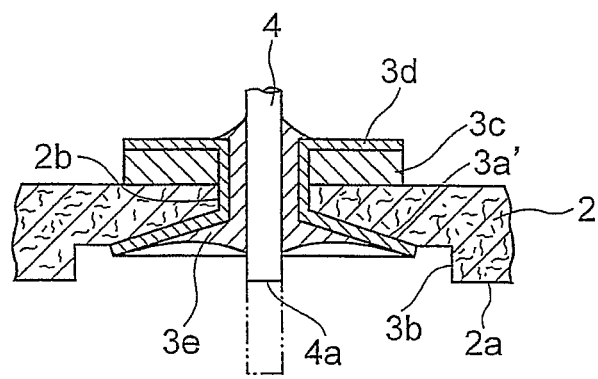
FIG. 4(b) shows a state in which a terminal (metal pin) is inserted into a through hole applied with copper plating, and after a solder or conductive adhesive is filled in the through hole, the tip end portion of the terminal is cut as shown by the imaginary line.

Moreover, as shown in FIGS. 4(a) and 4(b), a tapered portion (conical dish) can be formed instead of the second-stage counterbored portion shown in FIGS. 3(a) and 3(b), and the metal pin can be fixed to the through hole by a solder or conductive adhesive.

That is to say, as shown in FIG. 4(a), as seen from the direction of the ground (bottom) 2a of the base board 2, a tapered portion 3a' having a circular shape in plan view and a counterbored portion 3b having a larger diameter than that of the tapered portion 3a' are formed by a drill or the like around the through hole 2b formed in the base board 2, thereby constituting a tapered (disk-like) counterbored portion 3.

Subsequently, a copper foil 3c is formed around the through hole 2b on an upper face of the base board 2, and the copper-plated portion 3d is formed by electrolytic plating so as to cover the upper face of the copper foil 3c, the inner periphery of the through hole 2b, and the tapered portion 3a', thereby forming an electrode. An Ni-plated portion and a gold-plated portion can be further formed on the copper-plated portion 3d by electroless plating.

Thereafter, as shown in FIG. 4(b), the metal pin 4 is inserted into the through hole 2b around which the copper-plated portion 3d is formed, and a solder or conductive resin 3d is filled around the metal pin 4 to fix the metal pin 4 in the through hole 2b via the copper-plated portion 3d.

Moreover, heat from the heater element (not shown) arranged at the bottom of the circuit board 6 shown in FIG. 1 may escape from the end face through-holes 10a and 10b formed in the base board 2 to the mount board via the metal pin 4, due to a temperature difference between the heating temperature of the heater element and the mounting temperature of the mount board. Consequently, internal heat distribution of the crystal oscillator (OCXO) itself may change and frequency stability thereof may deteriorate.

Figure 5A:
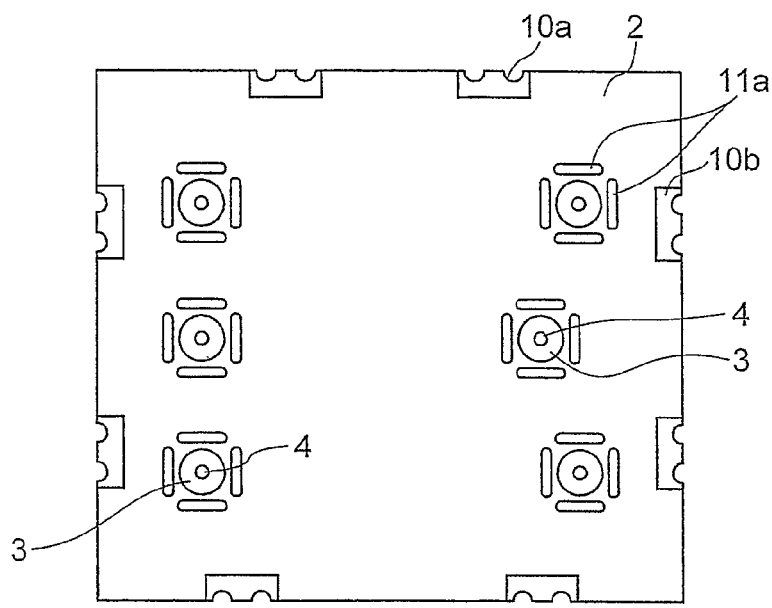
FIGS. 5(a) and 5(b) are bottom views of the surface mounted crystal oscillator of the present invention in which an oval slit that prevents escape of heat from a heater element to a mount board, is provided around a counterbored portion for fixing a metal pin formed in the base board of the crystal oscillator shown in FIG. 1 and FIG. 2.
Figure 5B:
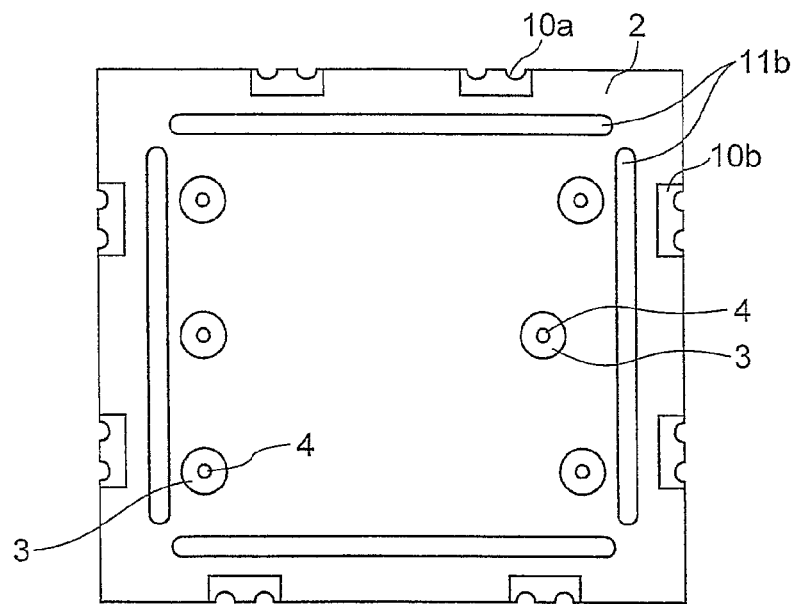
Figure 6:
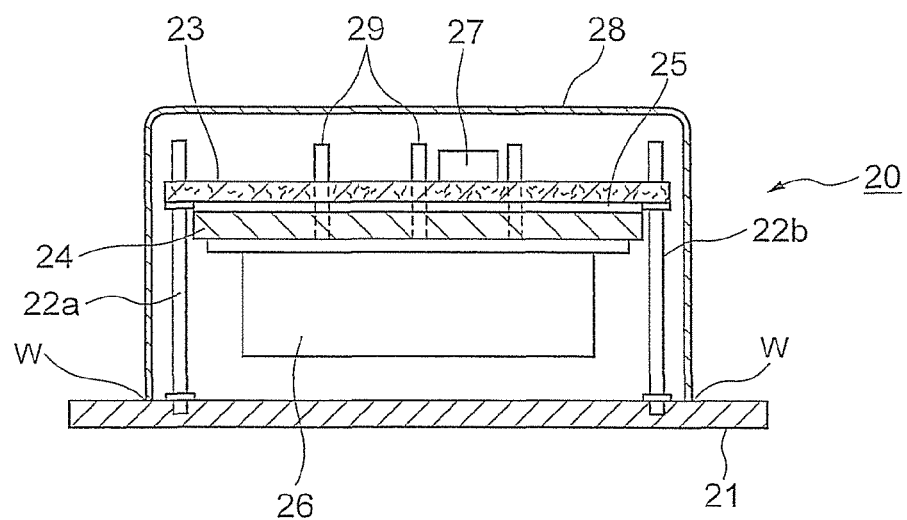
FIG. 6 is a longitudinal sectional view of a conventional surface mounted crystal oscillator.

Therefore, as shown in FIGS. 5(a) and 5(b), slits (notches) surrounding the metal pins 4 are formed so as to penetrate through the base board 2.

That is to say, as shown in FIG. 5(a), slits 11a and 11b having an oval shape as seen in plan view, are provided penetrating through the base board 2 proximity to four sides of each metal pin 4 fixed to the base board 2, at positions away from an outer circumference of the counterbored portion 3 by a predetermined dimension. Moreover, as shown in FIG. 5(b), long and thin groove-like penetrating slits (notches) 11b are provided parallel to each other between the counterbored portion 3 and the end face through-holes 10a and 10b so as to surround the plurality of metal pins 4 fixed to the base board 2 from four directions.

By these slits (notches) 11a and 11b, escape of heat from the heater element of the crystal oscillator 1 is prevented, thereby enabling to maintain frequency stability of the crystal oscillator 1.

[Industrial Applicability]

The surface mounted crystal oscillator of the present invention can be widely used for piezoelectric oscillators such as a voltage-controlled crystal oscillator (VCXO) and a temperature-compensated crystal oscillator (TCXO), other than the oven-controlled crystal oscillator (OCXO).

What is claimed is:

1. A surface mounted crystal oscillator in which a metal base provided with a plurality of protrusions at a bottom thereof is engaged with and placed on metal pins arranged in a standing condition in a plurality of through holes provided in a base board, and a circuit board is fitted to an upper end of said metal pins, and a crystal resonator is arranged on said circuit board via a heater element, and said metal base is covered with a metal cover, thereby obtaining a sealed structure of said crystal resonator, wherein a two-stage counterbored portion including a first-stage counterbored portion and a second-stage counterbored portion having a larger diameter than that of the first-stage counterbored portion is formed in the bottom of said base board around said metal pins, and a solder or conductive resin is filled in a gap between said first-stage counterbored portion, and said through hole and said metal pin to fix said metal pin in said though hole.

2. A surface mounted crystal oscillator according to claim 1, wherein a copper foil is adhered to an upper face of said base board around said through hole, and a copper-plated portion is formed so as to cover on an inner periphery of said through hole and an upper face of said copper foil, and said first-stage counterbored portion.

3. A surface mounted crystal oscillator according to claim 1, wherein said first-stage counterbored portion has a tapered shape.

4. A surface mounted crystal oscillator according to claim 1, wherein slits are formed proximity to four sides of each metal pin fixed to said base board, and penetrating through said base board.

5. A surface mounted crystal oscillator according to claim 1, wherein slits are formed proximity to two or four sides of said base board in parallel with each other so as to surround a plurality of said metal pins fixed to said base board, and penetrating through said base board.

* * * * *